(12) United States Patent
Chen et al.

(10) Patent No.: US 8,984,452 B2
(45) Date of Patent: Mar. 17, 2015

(54) LONG-RANGE LITHOGRAPHIC DOSE CORRECTION

(71) Applicant: Taiwan Semiconductor Manufacturing Company, Ltd., Hsin-Chu (TW)

(72) Inventors: Cheng-Hung Chen, Zhubei (TW); Shy-Jay Lin, Jhudong Township, Hsinchu County (TW); Jaw-Jung Shin, Hsinchu (TW); Wen-Chuan Wang, Hsinchu (TW); Pei-Yi Liu, Changhua (TW); Burn Jeng Lin, HsinChu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/966,013

(22) Filed: Aug. 13, 2013

(65) Prior Publication Data

US 2015/0052489 A1 Feb. 19, 2015

(51) Int. Cl.
*G06F 17/50* (2006.01)
(52) U.S. Cl.
CPC .................................. *G06F 17/5045* (2013.01)
USPC ................... 716/53; 716/51; 716/52; 716/54; 716/55; 430/5; 430/30
(58) Field of Classification Search
USPC ..................................... 716/50–56; 430/5, 30
See application file for complete search history.

(56) References Cited

U.S. PATENT DOCUMENTS

| | | | | |
|---|---|---|---|---|
| 8,443,311 | B2 * | 5/2013 | Arisawa et al. | 716/54 |
| 2006/0150131 | A1 * | 7/2006 | Lai et al. | 716/5 |
| 2006/0195815 | A1 * | 8/2006 | Ogino et al. | 716/21 |
| 2010/0175043 | A1 * | 7/2010 | Mukherjee et al. | 716/21 |
| 2011/0033789 | A1 * | 2/2011 | Ogino | 430/30 |
| 2013/0101941 | A1 * | 4/2013 | Fujimura et al. | 430/311 |

* cited by examiner

*Primary Examiner* — Nha Nguyen
(74) *Attorney, Agent, or Firm* — Haynes and Boone, LLP

(57) ABSTRACT

A method of quantifying a lithographic proximity effect and determining a lithographic exposure dosage is disclosed. In an exemplary embodiment, the method for determining an exposure dosage comprises receiving a design database including a plurality of features intended to be formed on a workpiece. A target region of the design database is defined such that the target region includes a target feature. A region of the design database proximate to the target region is also defined. An approximation for the region is determined, where the approximation represents an exposed area within the region. A proximity effect of the region upon the target feature is determined based on the approximation for the region. A total proximity effect for the target feature is determined based on the determined proximity effect of the region upon the target feature.

20 Claims, 12 Drawing Sheets

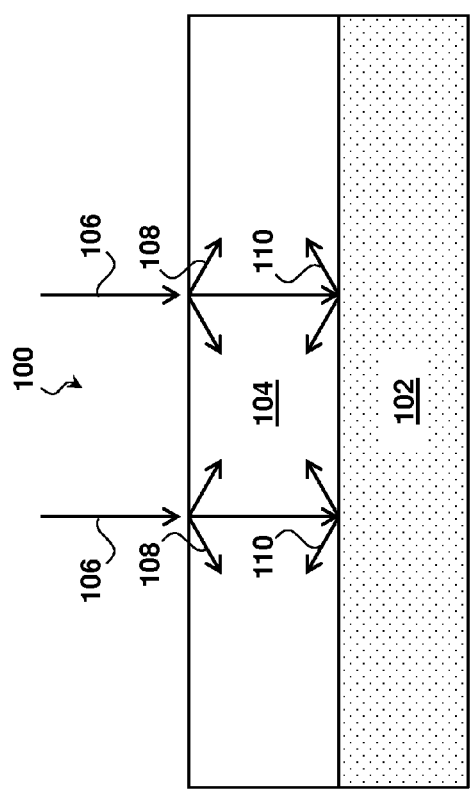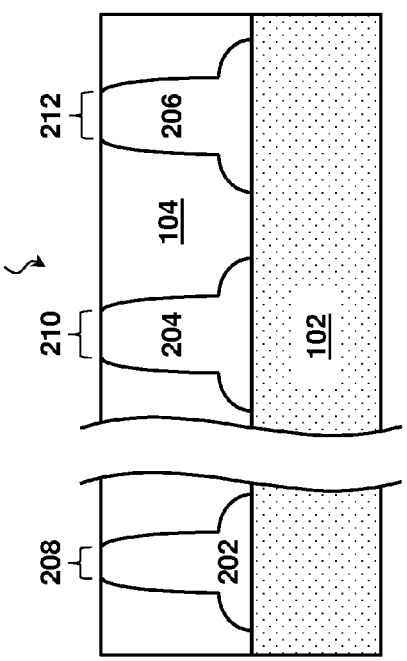

LONG-RANGE LITHOGRAPHIC DOSE CORRECTION

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of fabrication and verification processes for ICs, and, for improvements to be fully realized, further developments in IC manufacturing are needed.

As merely one example, advances in lithography have been important to reducing device size. In general, lithography is the transfer of a pattern onto a target such as a semiconductor substrate or mask. In photolithography, radiation such as ultraviolet light passes through or reflects off a mask before striking a photoresist coating on target. The mask transfers the pattern onto the photoresist, which is then selectively removed to reveal the pattern. The target then undergoes processing steps that take advantage of the shape of the remaining photoresist to create features on the target. Additionally or in the alternative, an electron beam (e-beam) may be used to expose the target either by exposing a photoresist or another material layer. As the name implies, electron-beam lithography directs a collimated stream of electrons to the area to be exposed. While precise, the narrow focus often makes e-beam lithography slower than photolithographic methods.

Despite remarkable advances in photolithography and e-beam lithography, increasing lithographic precision has increased the cost and complexity of the lithographic process. Therefore, while existing lithographic techniques have been generally adequate, they have not proved entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 is a cross-sectional view of a workpiece according to various aspects of the present disclosure.

FIG. 2 is a cross-sectional view of a workpiece after exposure according to various aspects of the present disclosure.

DETAILED DESCRIPTION

Figure 3:
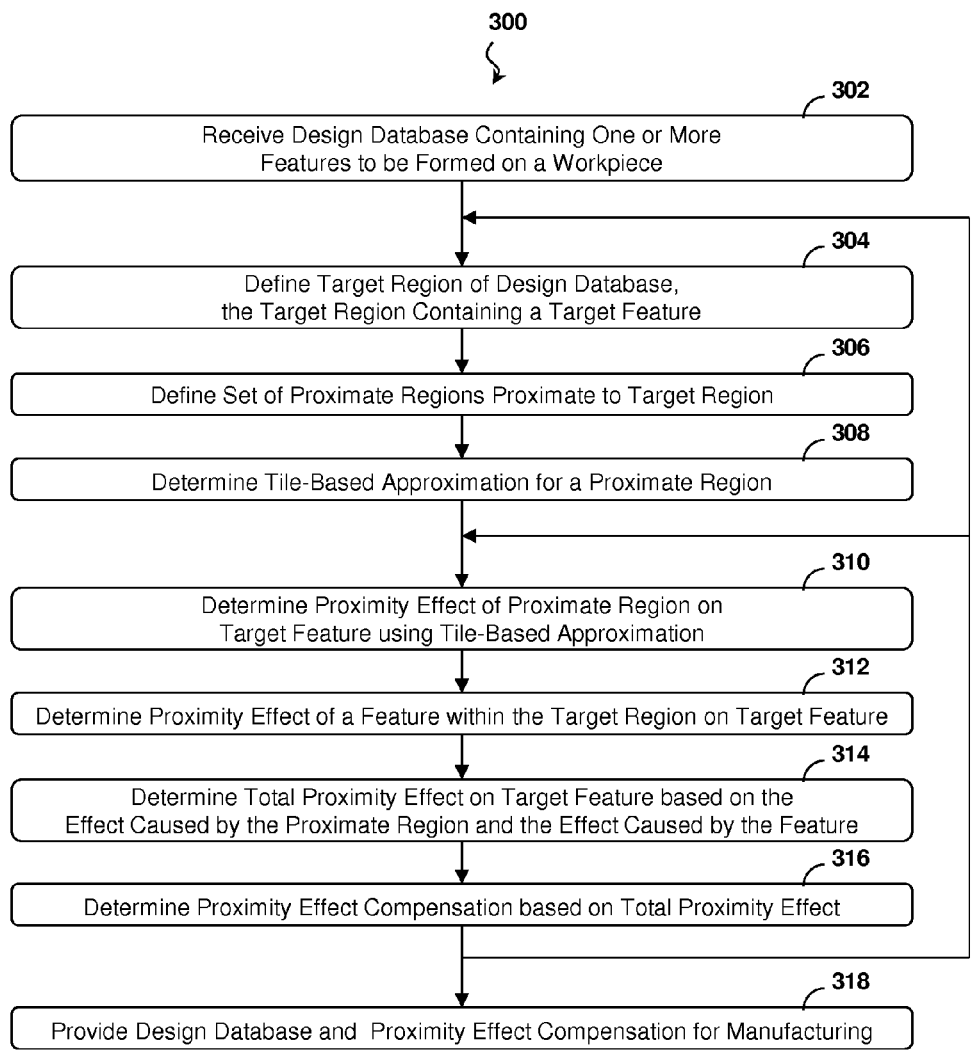
FIG. 3 is a flow diagram of a method for proximity effect modeling according to various aspects of the present disclosure.

The present disclosure relates generally to IC device manufacturing and, more particularly, to systems and methods for determining a lithographic proximity effect and for adjusting a lithographic process accordingly.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a cross-sectional view of a workpiece 100 according to various aspects of the present disclosure. FIG. 1 has been simplified for the sake of clarity and to better illustrate the concepts of the present disclosure. Additional features may be incorporated into the workpiece 100, and some of the features described below may be replaced or eliminated for other embodiments of the workpiece 100.

The workpiece 100 includes a substrate 102 such as a mask-type substrate or a semiconductor-type substrate. Suitable mask-type substrate materials include fused silica, fused quartz, calcium fluoride ($CaF_2$), and/or other suitable material, and a mask-type substrate 102 may include one or more absorption layers, attenuating layers, and/or reflective layers. Such absorption layers may include chromium (CR), MoSi, and/or other suitable materials. Attenuating layers may be formed from materials including metal silicide, metal nitride, iron oxide, inorganic material and/or other suitable materials. Reflective layers may be created using materials such as silicon/molybdenum, molybdenum/beryllium, and/or other suitable materials.

In some embodiments, a semiconductor-type substrate 102 includes an elementary semiconductor (e.g., silicon or germanium) and/or a compound semiconductor (e.g., silicon germanium, silicon carbide, gallium arsenic, indium arsenide, gallium nitride, and indium phosphide). Other exemplary substrate materials include alloy semiconductors, such as silicon germanium carbide, gallium arsenic phosphide, and gallium indium phosphide. The semiconductor-type substrate 102 may also comprise non-semiconductor materials including soda-lime glass, fused silica, fused quartz, calcium fluoride ($CaF_2$), and/or other suitable materials. In some embodiments, the semiconductor-type substrate 102 has one or more layers defined within it, such as an epitaxial layer. For example, in one such embodiment, the substrate 102 includes an epitaxial layer overlying a bulk semiconductor. Other layered substrates include semiconductor-on-insulator (SOI) substrates. In one such SOI substrate, the substrate 102 includes a buried oxide (BOX) layer formed by a process such as separation by implanted oxygen (SIMOX). In various embodiments, the substrate 102 may take the form of a planar substrate, a fin, a nanowire, and/or other forms known to one of skill in the art.

The substrate 102 may include one or more doped regions. For example, a region of the substrate 102 may be doped with a p-type dopant. Suitable p-type dopants include boron, gallium, indium, other suitable p-type dopants, and/or combinations thereof. The substrate may also include one or more regions doped with an n-type dopant such as phosphorus, arsenic, other suitable n-type dopants, and/or combinations thereof. Doping may be implemented using a process such as ion implantation or diffusion in various steps and techniques.

The substrate 102 may have one or more circuit devices formed on the substrate 102. These circuit devices may include P-channel field effect transistors (PFETs), N-channel FETs (NFETs), metal-oxide semiconductor field effect transistors (MOSFETs), complementary metal-oxide semiconductor (CMOS) transistors, FinFETs, high voltage transistors, high frequency transistors, bipolar junction transistors, diodes, resistors, capacitors, inductors, varactors, other suitable devices, and/or combinations thereof.

The workpiece includes a material layer 104 formed upon the substrate 102. In many embodiments, the material layer 104 includes a photoresist material. Photoresist materials are photoactive compounds that undergo a property change when exposed to lithographic energy at a dosage greater than some threshold of the photoresist. Based on this property change, exposed or unexposed portions of the photoresist can be selectively removed in order to transfer a pattern to the substrate 102. In that regard, the photoresist may be a positive- or negative-type resist and may be configured to be sensitive to any lithographic emission including ultra-violet (UV) light, deep ultra-violet (DUV) light, extreme ultra-violet (EUV) light, an e-beam, a laser, or other suitable emission type.

Referring still to FIG. 1, an incident lithographic emission is represented by arrow 106. In the illustrated embodiment, the lithographic emission is directed substantially perpendicular to workpiece 100. However, upon impact with the material layer 104, some portion of the exposure energy is radiated laterally as represented by arrow 108. In some lithographic processes, this effect is referred to as forward scatter. Likewise, the interface between the material layer 104 and the substrate 102 may reflect energy laterally as represented by arrow 110. This may be referred to as backscatter. These effects and others, broadly termed "proximity effects," may lead to regions of the material layer 104 having different total dosages (dosage from direct exposure plus dosage from indirect effects), which may cause the size and shape of the final features to vary. This has the potential to compromise pattern quality.

FIG. 2 is a cross-sectional view of a workpiece 200 after exposure according to various aspects of the present disclosure. FIG. 2 has been simplified for the sake of clarity and to better illustrate the concepts of the present disclosure. Workpiece 200 includes a substrate 102 and a material layer 104 substantially similar to those of FIG. 1.

Regions 202, 204, and 206 represent of regions of the material layer 104 that receive a lithographic dosage greater than the threshold. In the illustrated embodiment, each of regions 202, 204, and 206 experiences the same dosage from direct exposure and each has the same exposure area. However, the linewidths vary, in part, due to indirect exposure caused by exposing nearby regions. Thus, region 202 and regions 204 and 206 receive different total doses (dosage from direct exposure plus dosage from indirect effects). In the exemplary embodiment, region 202, having linewidth 208, has the smallest linewidth due, in part, to a lack of nearby exposed regions. Regions 204 and 206 have relatively larger linewidths 210 and 212 due, in part, to proximity effects between the regions.

Various types of proximity effect compensation may be used to compensate for these indirect exposure effects. One possible technique is to normalize the total dosage across the exposed regions of the material layer 104. This may include changing the direct exposure dosage for a region based on the indirect exposure dosage particular to the region. Selecting a proximity effect compensation technique, as well as determining an accurate compensation amount, depends on having an accurate model for the total dosage that includes the proximity effects experienced by a region of interest. These proximity effects can be modeled by the following equation:

$$\bar{\varepsilon}_0 = \sum_{J=1}^{m} n_j^0 \int_{A_K} \int_{A_J} f_p(r_{ij}) dA_j dA_i / A_K, K = 1, 2, \ldots, m$$

where $\epsilon_0$ represents the total dosages of m polygons experienced by a region i, $n_j$ represents the dosage from direct exposure experienced by of a nearby region j, $A_j$ represents the area of region j, and $f_p(r_{ij})$ is a proximity function that relates the energy deposited at the region i due to exposure of region j. From this equation, it can be seen that the indirect dose or proximity effect may be modeled by summing the individual proximity effect contributions of each nearby exposed area.

However, as device spacing is reduced, the number of nearby exposed features that have non-negligible effect grows. In an exemplary embodiment, a region of interest includes on the order of $6 \times 10^6$ features that contribute to the indirect exposure dose. The result is a 6,000,000×6,000,000 matrix calculation to determine the total proximity effect of a single region of a design:

$$\begin{bmatrix} C_{1,1} & C_{1,2} & \ldots & C_{1,6M} \\ C_{2,1} & C_{2,2} & \ldots & C_{2,6m} \\ \ldots & \ldots & \ldots & \ldots \\ C_{6M,1} & C_{6M,2} & \ldots & C_{6M,6M} \end{bmatrix} \begin{bmatrix} n_1 \\ n_2 \\ \ldots \\ n_j \end{bmatrix} = \bar{\varepsilon}_0$$

where $C_{a,b}$ may represented as:

$$C_{a,b} = \int_{A_a} \int_{A_b} f_p(r_{ij}) dA_j dA_i / A_a$$

and $n_a$ represents the dosage from direct exposure experienced by region a. Even with modern computing systems, this is a substantial number of calculations and may result in unacceptably long run times. In order to reduce the number of calculations without sacrificing accuracy, in some embodiments, a tile-based proximity effect calculation is used as described in detail below.

A method for proximity effect modeling is disclosed with reference to FIG. 3 and FIGS. 4-7. FIG. 3 is a flow diagram of the method 300 for proximity effect modeling according to various aspects of the present disclosure. It is understood that additional steps can be provided before, during, and after the method 300 and that some of the steps described can be replaced or eliminated for other embodiments of the method 300. FIGS. 4-7 are diagrammatic representations of a design database 400 undergoing the method 300 for proximity effect modeling according to various aspects of the present disclosure.

The design database 400 includes a number of features 402 intended to be formed on a workpiece, such as workpiece 100 of FIG. 1 or workpiece 200 of FIG. 2. In various embodiments, the features 402 correspond to mask features (e.g., transparent regions, opaque regions, reflective regions, etc.) and/or circuit features (e.g., doped regions, isolation features, gate stacks, interconnects, vias, etc.). FIGS. 4-7 have been simplified for the sake of clarity and to better illustrate the concepts of the present disclosure. For example, a typical design database may include $10^{10}$ features or more. The features 402 of the design database 400 may be represented in any design standard such as GDSII, OASIS, or MEBES®, a registered trademark of Applied Materials.

Figure 4:
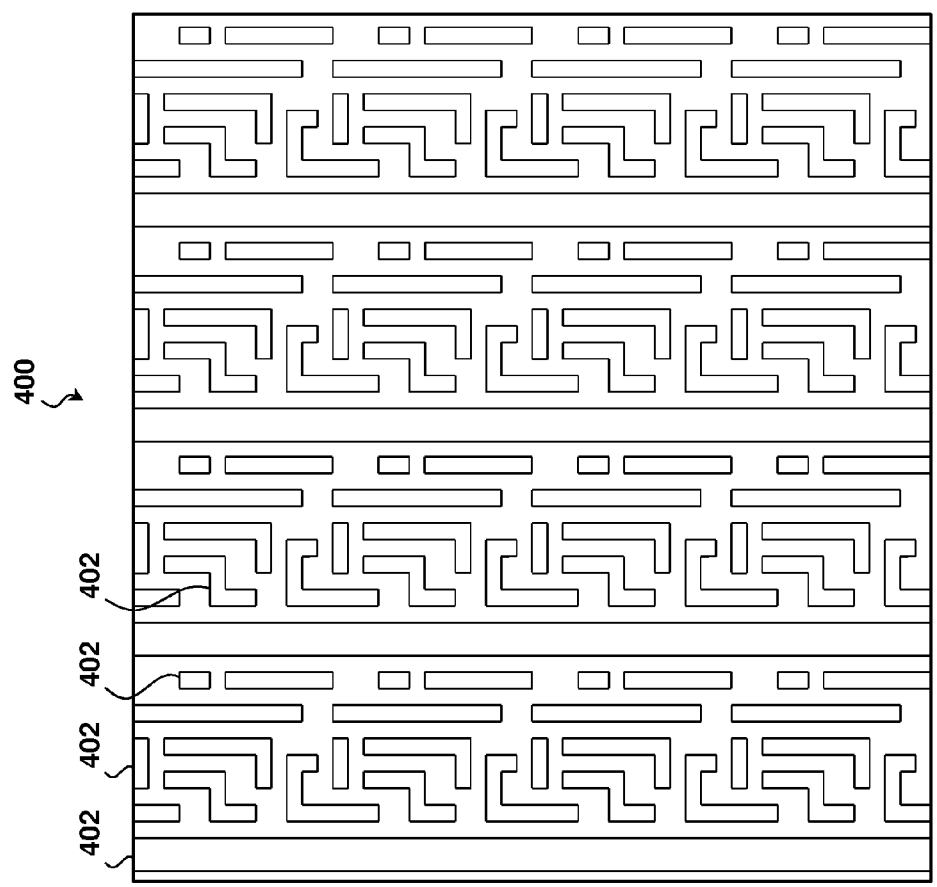
FIGS. 4-7 are diagrammatic representations of a design database undergoing a method for proximity effect modeling according to various aspects of the present disclosure.

Referring to block 302 of FIG. 3 and to FIG. 4, a design database 400 is received at a computing system. The design database 400 includes a plurality of features 402 to be formed on a workpiece. Referring to block 304 of FIG. 3 and to FIG. 5, a target region 502 of the design database is defined. The target region 502 contains one or more target features 504 (selected from the plurality of features 402) at which the proximity effects (i.e., indirect exposure effects) are to be determined. In various embodiments, few, some, or all of the plurality of features 402 are selected as target features 504. Determining proximity effects at all available features may provide greater accuracy, but may increase the number of calculations. Accordingly, in some embodiments, target features 504 are selected based on some metric of criticality.

Figure 5:
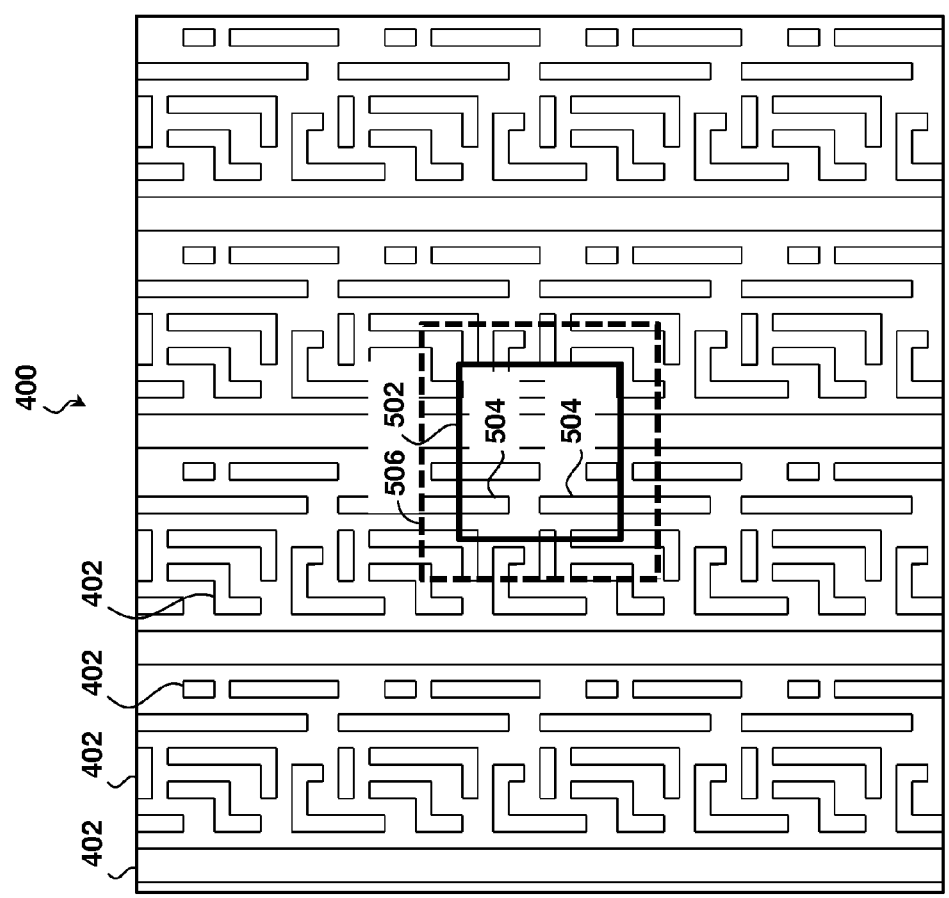

Referring still to block 304 of FIG. 3 and to FIG. 5, in some embodiments, defining the target region 502 includes defining a perimeter region or ambit region 506 surrounding the target region 502. As will be explained in detail below, regions of the design database 400 proximate to the target region 502 may be replaced by tile-based approximations in order to reduce the number of calculations. Because proximity effects dissipate over distance, any error in the approximation is minimized. However, for target features 504 near the boundary of the target region 502, the relatively shorter distance between the target feature 504 and the tile-based approximations may make approximation errors more significant. Accordingly, an ambit region 506 that contains no target features 504 may be set aside and excluded from the tile-based approximation.

Figure 6:
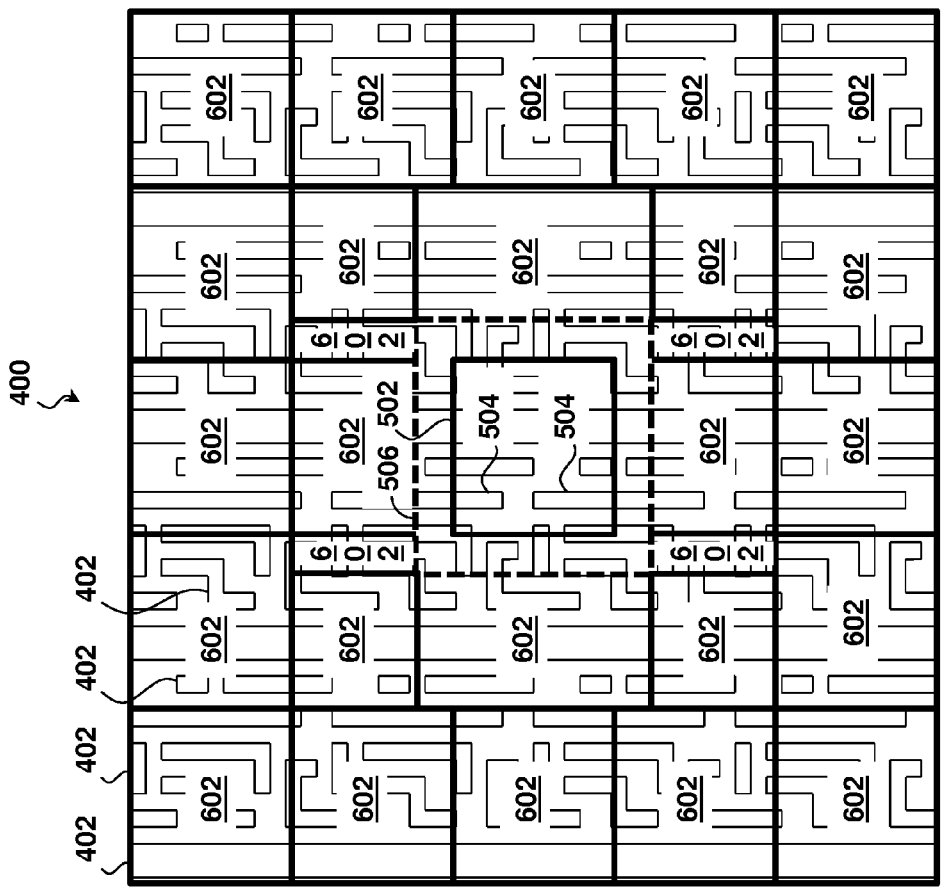

Referring to block 306 of FIG. 3 and to FIG. 6, a set of proximate regions 602 of the design database 400 is defined. The proximate regions 602 may be defined based on distance from the target region 502. In an exemplary embodiment, the proximate regions 602 are defined as areas located close enough to the target region 502 to have measureable proximity effect upon the designated target features 504 of interest (i.e., proximate regions are regions within the "full range" of the proximity effect). As can be seen, the proximate regions 602 may be defined to have any suitable size and shape. Generally, smaller proximate regions 602 have more accurate tile-based approximations but consume more processing resources because they tend to be more numerous. In an exemplary embodiment, proximate regions 602 are defined to be approximately 2 μm by 2 μm.

Figure 7:
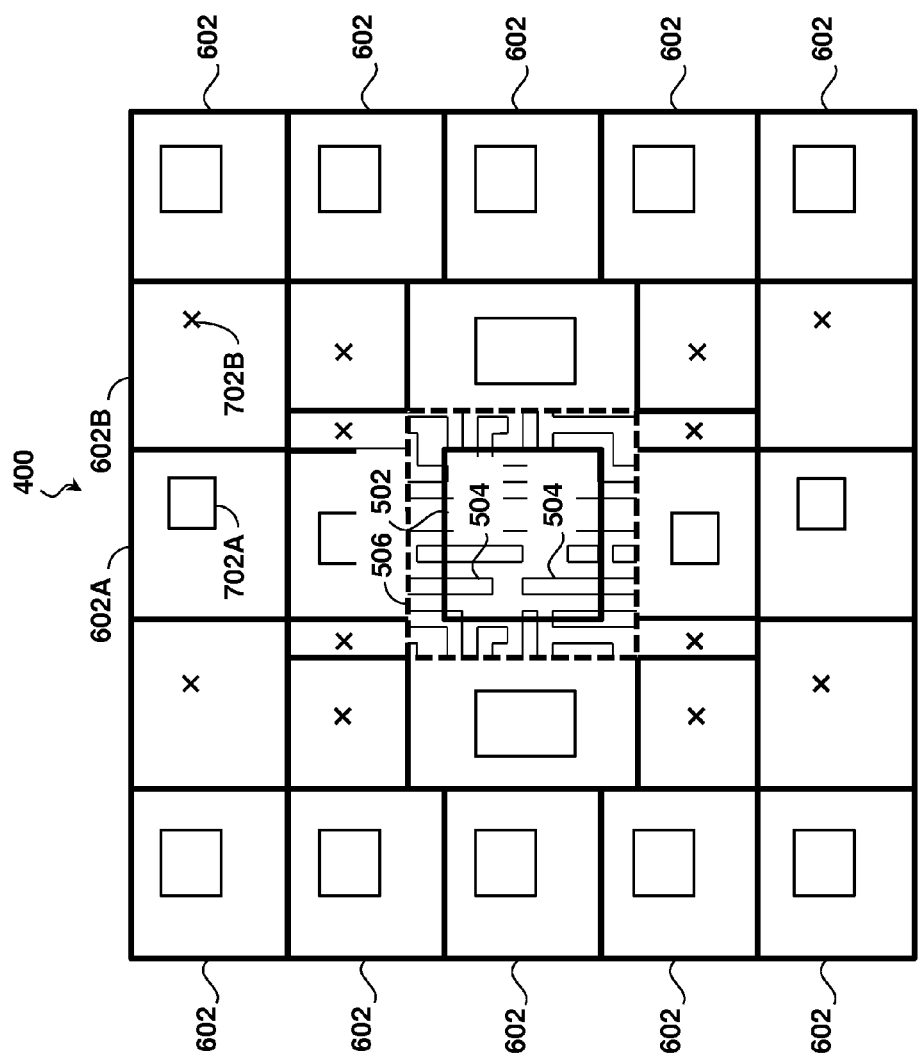

Referring to block 308 of FIG. 3 and to FIG. 7, a tile-based approximation is determined for each proximate region 602. Experimentation has demonstrated that, for the purposes of determining proximity effects, distant features 402 can be combined into an aggregate feature without significantly affecting the accuracy of the proximity effect determination. Accordingly, combining features 402 greatly reduces the number of calculations used to determine the effect at a target feature 504 without compromising precision. In some exemplary embodiments, determining a tile-based approximation for a proximate region 602 includes determining an aggregate feature having a substantially equivalent density as the respective proximate region 602. Density refers to the ratio of exposed area to total area. As features 402 may represent either exposed areas or unexposed areas, determining the tile-based approximation may include a piecewise summation of the feature area or the non-feature area of the respective proximate region 602.

The tile-based approximation may take any suitable form or representation. For example, the tile-based approximation for proximate region 602A includes an aggregate feature having a shape 702A and a density value. The shape 702A is centered at the center of mass of the exposed area of the proximate region 602A. For the purposes of determining proximity effects, the shape 702A is treated as a single entity having the respective density. In that regard, the density value may be any value and, in various embodiments, ranges from 0 to 1.0, inclusive. As a further example, the tile-based approximation for proximate region 602B takes the form of a point 702B located at the center of mass of the exposed area of the proximate region 602B. The point 702B has an associated measurement of exposed area that corresponds to the total exposed area of the proximate region 602B. In some embodiments, the tile-based approximation (e.g., approximation 702A or 702B) includes a measure of the total lithographic exposure dosage within the respective proximate region in addition to or as an alternative to a measure of the exposed area.

Referring to block 310 of FIG. 3, a target feature 504 within the target region 502 is selected, and the proximity effects caused by the proximate regions 602 upon the target feature 504 are determined. More specifically, the proximity effects caused by the features 402 within the proximate regions 602 upon the target feature 504 are determined. However, in order to reduce the number of calculations, a tile-based approximation is substituted for the features 402 of the region 602. In other words, the approximation is used to determine the effect of the proximate region 602 rather than determining the effect of each feature 402 individually. Thus, in the illustrated embodiment having 28 defined proximate regions 602, only 28 separate determinations are made for each target feature 504 rather than millions. In some embodiments, the ambit region 506 is treated as a proximate region 602 for the purposes of this determination. The proximity effects caused by the proximate regions 602 may be modeled using the equation:

$$\varepsilon(r_i) = \sum_{J=1}^{m} n_j^0 \int_{A_J} f_p(r_{ij}) dA_J$$

where $\varepsilon(r_i)$ represents the proximity effect upon target feature i, $n_j$ represents the exposure intensity of the proximate region j, $A_j$ represents the exposed area of the proximate region j (obtained from the tile-based approximation), and $f_p$ is the attenuation function over distance. It is understood that this equation is merely exemplary and that other methods of determining the proximity effect of a proximate region upon a target feature using the tile-based approximation are both contemplated and provided for.

Referring to block 312 of FIG. 3, the proximity effects caused by features 402 within the target region 502 upon the target feature 504 are determined. Because features within the target region 502 (and those within the ambit region 506, where applicable) are closer to the target feature 504 than those of the proximate regions 602, they may have more pronounced proximity effects. Thus, the actual features 402 may be used in the determination rather than an approximation in order to provide greater accuracy. Accordingly, in embodiments that define an ambit region 506, the determination of block 312 may include determining the proximity effects caused by features 402 within the ambit region 506 upon the target feature 504. The proximity effects of the features 402 within the target region 502, and ambit region 506 where applicable, may be determined as described above, using the equation:

$$\bar{\varepsilon}_0 = \sum_{J=1}^{m} n_j^0 \int_{A_K} \int_{A_J} f_p(r_{ij}) dA_J dA_i/A_K, K = 1, 2, \ldots, m$$

where $\varepsilon_0$ represents the total dosages of m polygons experienced by a region i, $n_j$ represents the dosage from direct exposure experienced by of a nearby region j, $A_j$ represents the area of region j, and $f_p(r_{ij})$ is a proximity function that relates the energy deposited at the region i due to exposure of region j.

Referring to block 314 of FIG. 3, a total proximity effect upon the target feature 504 is determined based on the effects caused by the proximate regions as determined in block 310 and the effects caused by the features 402 within the target region 502 and ambit region 506 as determined in block 312.

Referring to block 316 of FIG. 3, a proximity effect compensation for the target feature 504 is determined based on the total proximity effect. The compensation may take any form. In some exemplary embodiments, the compensation includes an adjustment to the lithographic exposure intensity or direct exposure dosage. One suitable dosage adjustment technique is referred to as a Self-Consistent Proximity Effect Compensation Technique for Resist Exposure (SPECTRE). SPECTRE aims to adjust the exposure intensity delivered to features 402 so that each feature 402 experiences the same or similar overall intensity. SPECTRE refers to this as "equal specific fragmentation." As the intensity affects the minimum linewidth or "critical dimension" of a feature 402, SPECTRE normalizes the intensity of the features 402 in order to promote critical dimension uniformity. SPECTRE does this by compensating for proximity effects so that features 402 in dense areas will receive a smaller direct exposure dose than features 402 in sparse areas. In many embodiments, SPECTRE utilizes the equations above to determine proximity effects caused by features 402 and/or tiled regions. Thus, in some embodiments, the determinations of one or more of blocks 310, 312, and 314 and the compensation of block 316 may be performed in a single iteration of SPECTRE. Additionally or in the alternative, other intensity adjustment techniques may be used including other critical-dimension-based techniques. Furthermore, the type of proximity effect compensation of block 316 is not limited to adjusting lithographic exposure intensity.

The process of blocks 310-316 may be repeated for additional target features 504 within the target region 502. Similarly, the process of blocks 304-316 may be repeated for additional target regions 502 within the design database 400. Referring to block 318, the design database 400 and the proximity effect compensation are provided for manufacturing of the associated workpiece.

Figure 8:
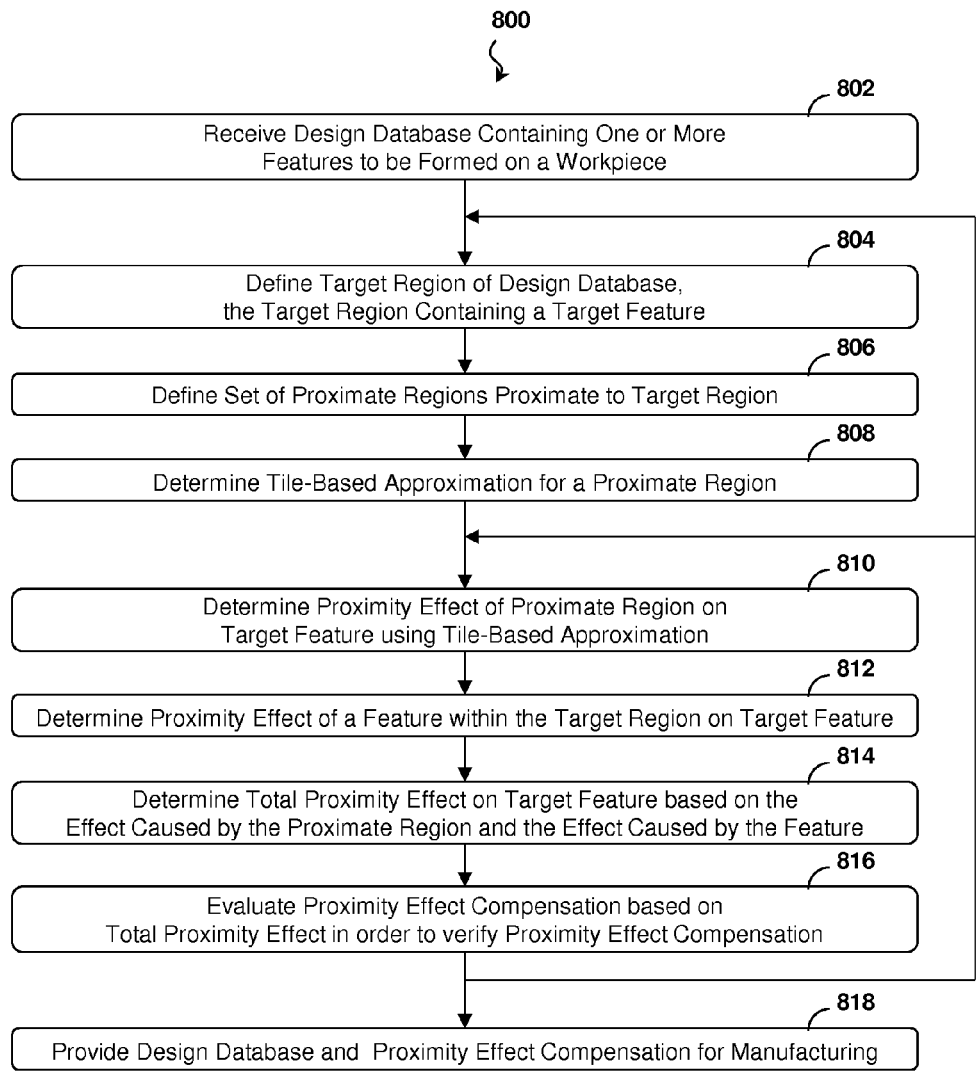
FIG. 8 is a flow diagram of a method for verifying a proximity effect compensation according to various aspects of the present disclosure.

A method for verifying the proximity effect compensation is disclosed with reference to FIG. 8 and FIGS. 9-12. FIG. 8 is a flow diagram of the method 800 for verifying the proximity effect compensation according to various aspects of the present disclosure. It is understood that additional steps can be provided before, during, and after the method 800 and that some of the steps described can be replaced or eliminated for other embodiments of the method 800. FIGS. 9-12 are diagrammatic representations of a design database 900 undergoing the method 800 for verifying the proximity effect compensation according to various aspects of the present disclosure. The design database 900 may be substantially similar to the design database 400 disclosed with reference to FIG. 4 and includes a plurality of features 400 to be formed in a workpiece.

Just as the lithographic exposure of a feature 402 may result in proximity effects in a nearby feature 402, adjustments to the lithographic process may result in changes in proximity effects between features 402. For example, a proximity effect compensation may include adjusting a direct exposure dose for a target feature 504. However, the adjustment may affect the total dose at both the target feature 504 and surrounding features. Accordingly, in some embodiments, an adjustment to a photolithographic process, such as the proximity effect compensation determined in block 316 of FIG. 3, is verified to ensure that it produces suitable results.

Figure 9:
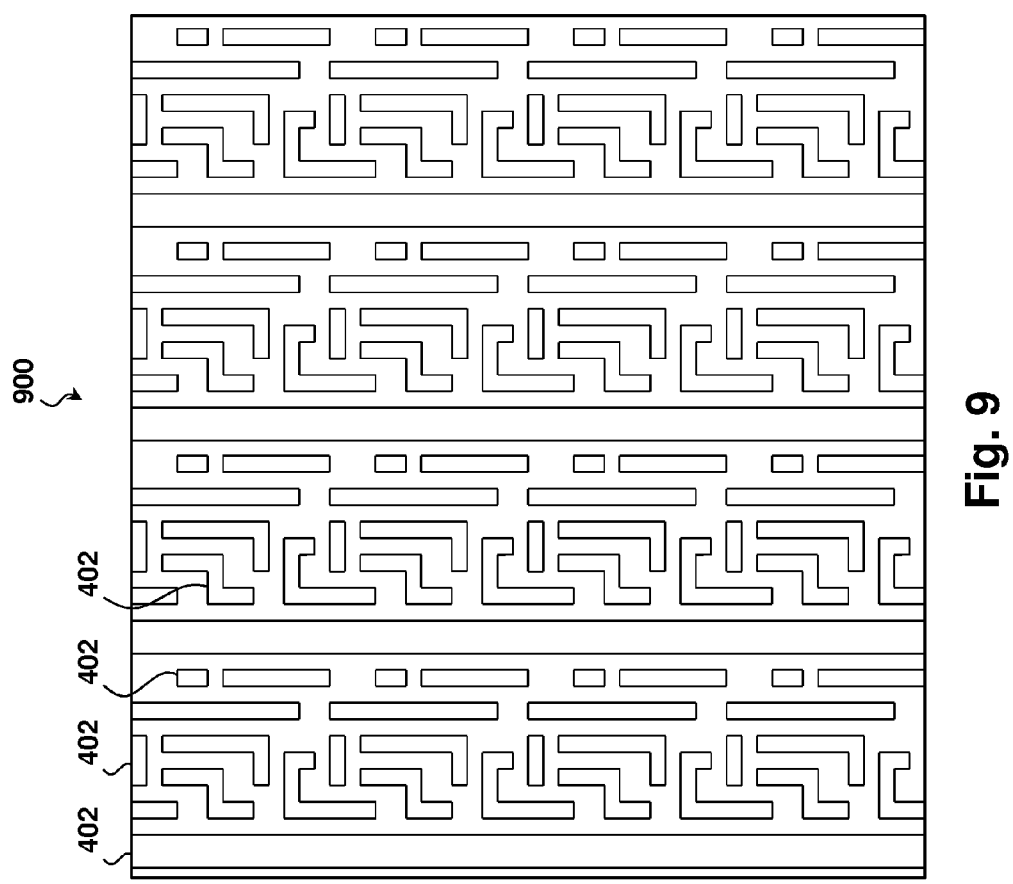
FIGS. 9-12 are diagrammatic representations of a design database undergoing a method for verifying a proximity effect compensation according to various aspects of the present disclosure.

Referring to block 802 of FIG. 8 and to FIG. 9, a design database 900 is received. In some embodiments, this includes receiving a set of proximity effect compensations to be applied to the design database 900. The set of proximity effect compensations may include one or more adjustments to be made to a lithographic process.

Figure 10:
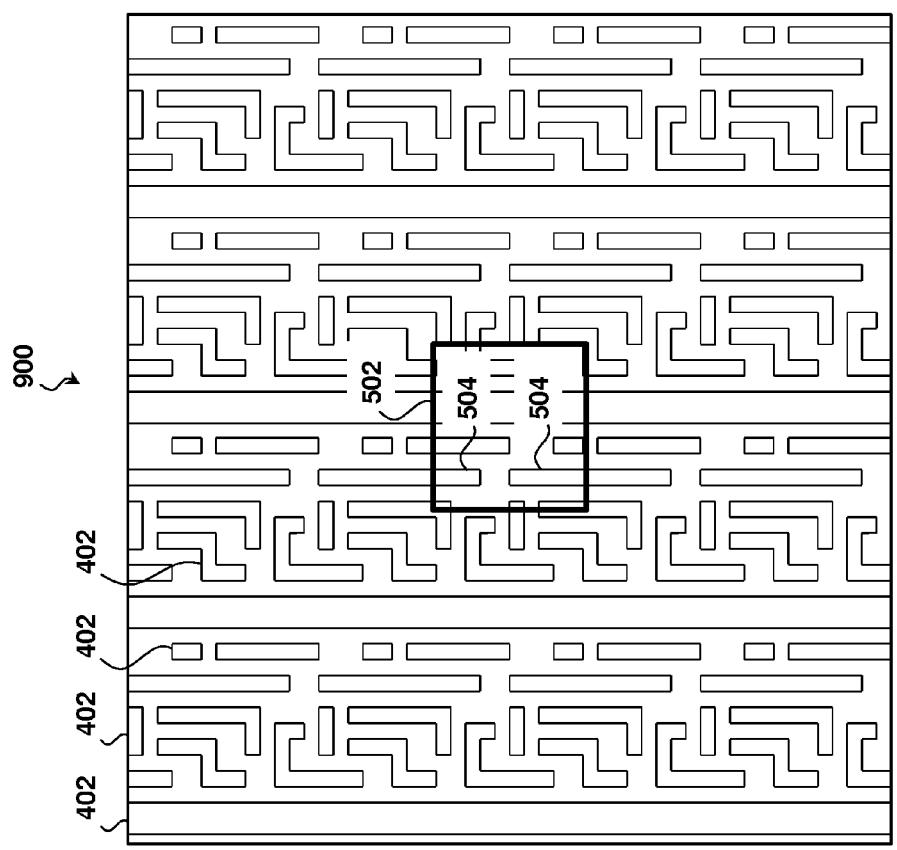

Referring to block 804 of FIG. 8 and to FIG. 10, a target region 502 of the design database is defined. This may be performed substantially as described in block 304 of FIG. 3. The target region 502 contains one or more target features 504 at which the indirect exposure effects or proximity effects are to be determined. In many embodiments, the target features 504 correspond to features 402 and are selected in order to determine the proximity effects experienced by the respective feature 402. A feature 402 may have any number of corresponding target features 504, including none. Although not illustrated, in some embodiments, defining the target region 502 includes defining a perimeter region or ambit region 506 surrounding the target region 502.

Figure 11:
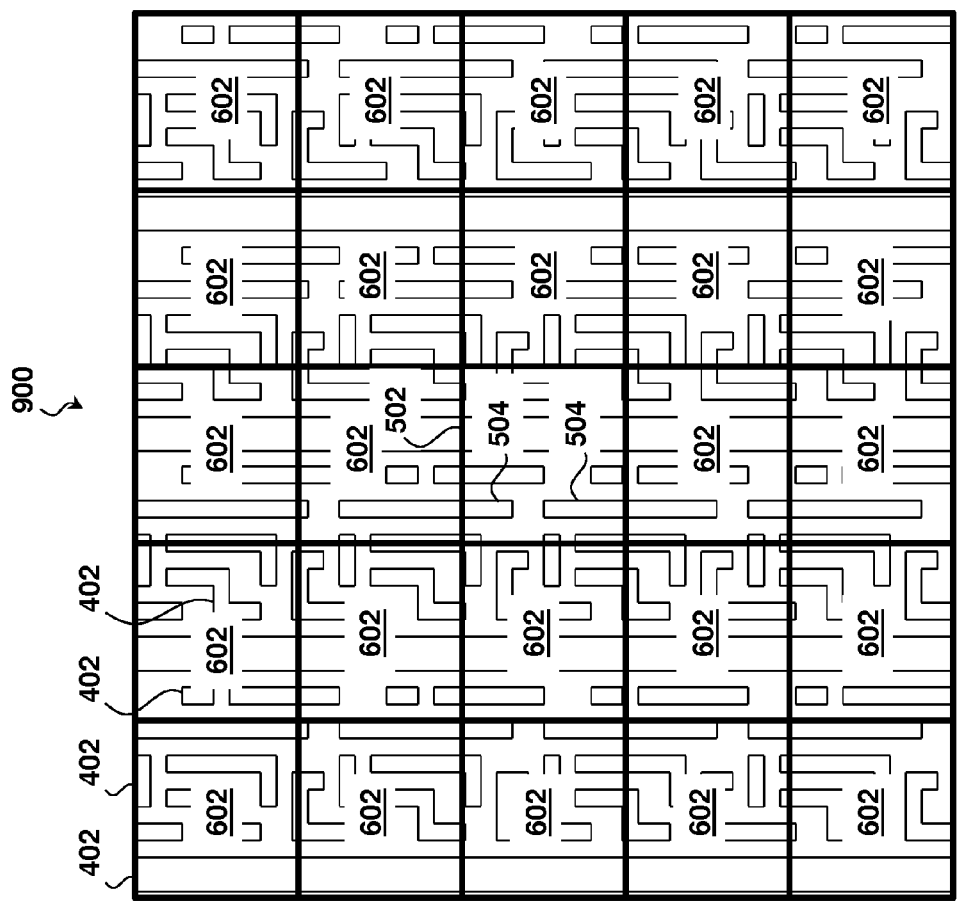
Figure 12:
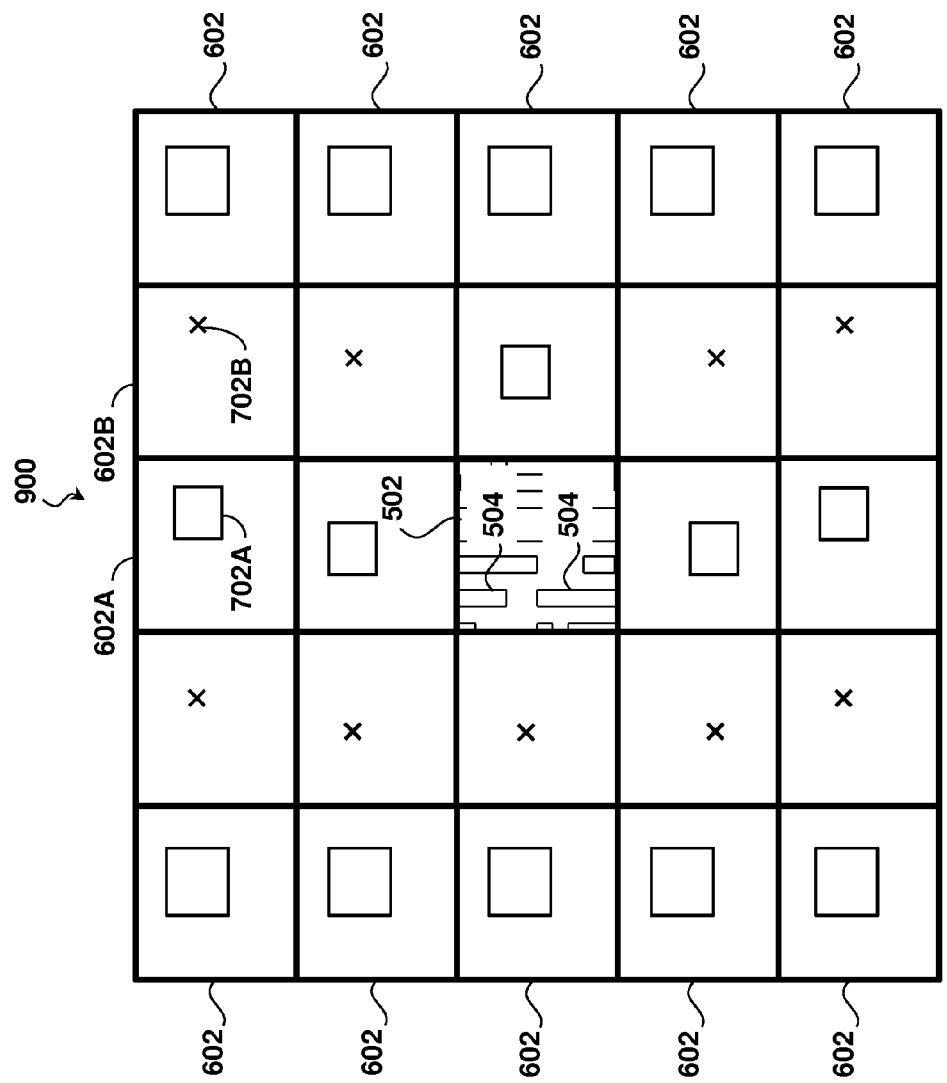

Referring to block 806 of FIG. 8 and to FIG. 11, a set of proximate regions 602 of the design database 900 is defined. This may be performed substantially as described in block 306 of FIG. 3. Referring to block 808 of FIG. 8 and to FIG. 12, a tile-based approximation is determined for each proximate region 602 substantially as described in block 308 of FIG. 3. The tile-based approximation may take any suitable form or representation including an aggregate feature 702A and/or point 702B. Referring to block 810 of FIG. 8, a target feature 504 within the target region 502 is selected and the proximity effects caused by the proximate regions 602 upon the target feature 504 are determined substantially as described in block 310 of FIG. 3. The determination of block 810 accounts for any compensations or adjustments to a lithographic process to be applied to features within the proximate region 602. Accordingly, in an exemplary embodiment, determining the proximity effect caused by a proximate region 602 includes applying a proximity effect compensation to the proximate region 602.

Referring to block 812, the proximity effects caused by features 402 within the target region 502 upon the target feature 504 are determined substantially as described in block 312 of FIG. 3. In some embodiments, this includes determining the proximity effects caused by features 402 within the ambit region 506 upon the target feature 504, although in many embodiments, an ambit region 506 is not defined or used. The determination of block 812 accounts for any compensations or adjustments to a lithographic process to be applied to features 402 within the target region 502. Accordingly, in an exemplary embodiment, determining the proximity effect caused by a feature 402 includes applying a proximity effect compensation to the feature 402. Referring to block 814 of FIG. 8, a total proximity effect upon the target feature 504 is determined based on the effects caused by the proximate regions as determined in block 810 and the effects caused by the features 402 within the target region 502 and ambit region 506 as determined in block 812.

Referring to block 816 of FIG. 8, the effects of the adjustments upon the total proximity effect for target feature 504 are evaluated in order to verify the adjustments. For example, in some embodiments, verifying the adjustments includes evaluating whether a linewidth of the target feature 504 (commonly referred to as a "critical dimension") is sufficiently small or sufficiently large. As discussed in the context of FIG. 2, nearby features 402 tend to increase linewidth and critical dimension due, in part, to proximity effects. Critical dimension may be reduced using proximity effect compensation. However, the compensation should not risk of producing a feature that is too thin to be reliable. In some embodiments, verifying the adjustments includes evaluating whether points within the target feature 504 will receive a total dosage exceeding the photoresist threshold. Depending on the particular target feature 504, failing to meet the photoresist threshold may indicate that the dosage is too small and that the compensation is incorrect. In contrast, for some points near the target features 504, verifying the adjustments includes evaluating whether points within the target feature 504 will receive a total dosage less than the photoresist threshold. The verification of block 816 ensures that the proximity effect compensation produces reliable features having critical dimensions that meet or exceed the standard for the technology node.

The process of blocks 810-816 may be repeated for additional target features 504 within the target region 502. Similarly, the process of blocks 804-816 may be repeated for additional target regions 502 within the design database 900. Referring to block 818, the design database 900 and the set of proximity effect compensations are provided for manufacturing of the associated workpiece.

Figure 13:
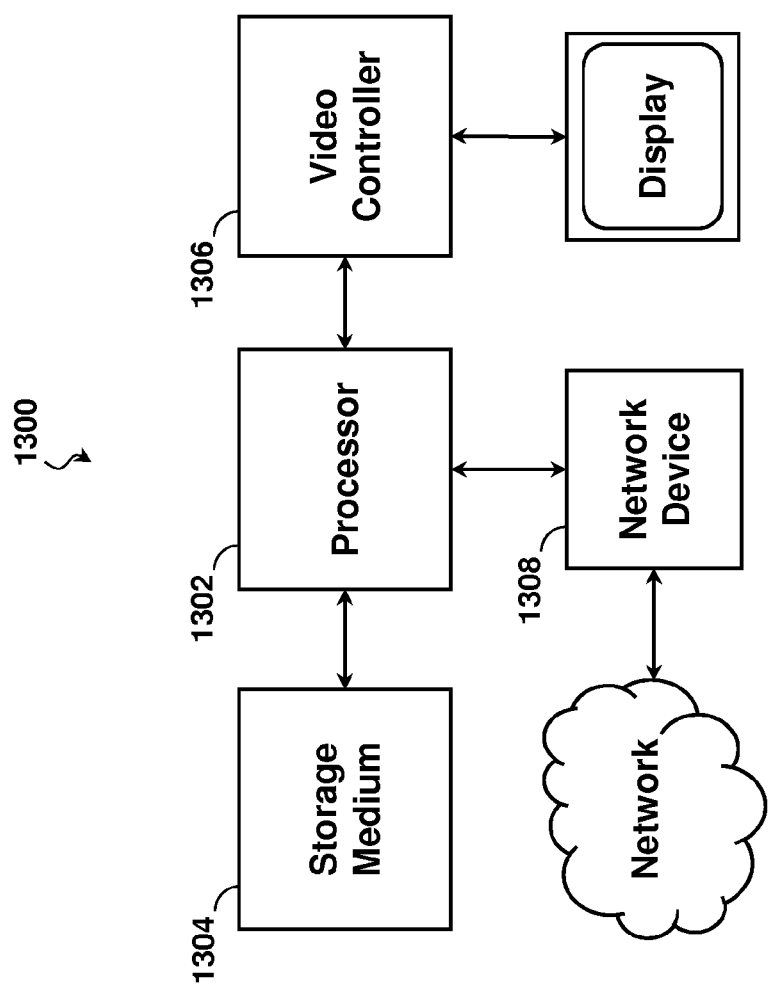
FIG. 13 is a system diagram of a computing system according to various aspects of the present disclosure.

FIG. 13 is a system diagram of a computing system 1300 according to various aspects of the present disclosure. The computing system 1300 may include a processor 1302 such as a microcontroller or a dedicated central processing unit (CPU), a non-transitory computer-readable storage medium 1304 (e.g., a hard drive, random access memory (RAM), a compact disk read only memory (CD-ROM), etc.), a video controller 1306 such as a graphics processing unit (GPU), and a network communication device 1308 such as an Ethernet controller or wireless communication controller. In that regard, in some embodiments, the computing system 1300 is programmable and is programmed to execute processes including those associated with proximity effect determination and compensation. Accordingly, it is understood that any operation of the computing system 1300 according to the aspects of the present disclosure may be implemented by the computing system 1300 using corresponding instructions stored on or in a non-transitory computer readable medium accessible by the processing system.

The computing system 1300 is operable to perform one or more of the processes described with respect to FIGS. 3 and 8. In that regard, in various embodiments, the computing system 1300 is operable to: receive a design database 400, define a target region 502, define a set of proximate regions 602, determine a tile-based approximation for a proximate region 602, determine a proximity effect of a proximate region 602 upon a target feature 504, determine a proximity effect of a feature 402 upon a target feature 504, determine a total proximity effect upon a target feature 504, determine a proximity effect compensation for a target feature 504, and/or provide a design database 400 and a proximity effect compensation for manufacturing a corresponding workpiece. In various further embodiments, the computing system 1300 is operable to: receive a design database 900, receive a set of proximity effect compensations, define a target region 502, define a set of proximate regions 602, determine a tile-based approximation for a proximate region 602, determine a proximity effect of a proximate region 602 upon a target feature 504, determine a proximity effect of a feature 402 upon a target feature 504, determine a total proximity effect upon a target feature 504, evaluate a proximity effect compensation, and/or provide a design database 900 and a proximity effect compensation for manufacturing a corresponding workpiece.

The present embodiments can take the form of an entirely hardware embodiment, an entirely software embodiment, or an embodiment containing both hardware and software elements. Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium can be any apparatus that can store the program for use by or in connection with the instruction execution system, apparatus, or device. The medium may include non-volatile memory including magnetic storage, solid-state storage, optical storage, cache memory, Random Access Memory (RAM).

Thus, the present disclosure provides a system and method for determining a lithographic proximity effect and for adjusting a lithographic process accordingly. In some embodiments, method for determining a lithographic exposure dosage is provided. The method comprises: receiving a design database including a plurality of features, wherein the plurality of features are intended to be formed on a workpiece; defining a target region of the design database, wherein the target region includes a target feature; defining a region of the design database proximate to the target region; determining an approximation for the region, wherein the approximation represents an exposed area within the region; determining a proximity effect of the region upon the target feature based on the approximation for the region, wherein the determining of the proximity effect is performed using a computer; and determining a total proximity effect for the target feature based on the determined proximity effect of the region upon the target feature.

In further embodiments, a method is provided comprising: receiving a design database including a plurality of features intended to be formed on a workpiece; selecting a target feature within the design database; defining a first region of the design database, wherein the first region includes the target feature; defining a second region outside the first region, wherein the second region is located sufficiently close to the target feature to have a measureable lithographic proximity effect upon the target feature; determining a tile-based approximation corresponding to a plurality of features located within the second region; and determining a proximity effect of the second region upon the target feature based on the tile-based approximation, wherein the determining of the proximity effect is performed using a computer In yet further embodiments, a method of verifying a proximity effect compensation is provided. The method comprises: receiving a design database including a plurality of features intended to be formed on a workpiece; defining a target region of the design database, wherein the target region includes a target feature; defining a region of the design database proximate to the target region; determining an approximation for the region, wherein the approximation represents an exposed area within the region; determining a proximity effect of the region upon the target feature based on the approximation for the region, wherein the proximity effect accounts for a proximity effect compensation applied to a feature located within the region, and wherein the determining of the proximity effect is performed using a computer; and evaluating the proximity effect compensation based on the proximity effect of the region upon the target feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for determining a lithographic exposure dosage, the method comprising:
    receiving a design database including a plurality of features, wherein the plurality of features are intended to be formed on a workpiece;
    defining a target region of the design database, wherein the target region includes a target feature;
    defining a region of the design database proximate to the target region;
    determining an exposed area within the region;
    determining a center of mass of the exposed area within the region;
    defining a shape located at the center of mass and having a measurement of exposed area corresponding to the exposed area within the region;
    determining a proximity effect of the region upon the target feature based on the defined shape, wherein the determining of the proximity effect is performed using a computer; and
    determining a total proximity effect for the target feature based on the determined proximity effect of the region upon the target feature.

2. The method of claim 1 further comprising determining a proximity effect of a feature within the target region upon the target feature, wherein the total proximity effect is further based on the determined proximity effect of the feature upon the target feature.

3. The method of claim 1 further comprising:
    determining a proximity effect compensation based on the total proximity effect; and
    providing the design database and the proximity effect compensation for manufacturing.

4. The method of claim 3, wherein the proximity effect compensation is configured to adjust an exposure dose in order to equalize intensities across a plurality of target features of the design database.

5. The method of claim 3 further comprising determining a critical dimension produced by the proximity effect compensation in order to verify the proximity effect compensation.

6. The method of claim 1 further comprising:
    defining an ambit region surrounding the target region; and
    determining a proximity effect of a feature within the ambit region upon the target feature, wherein the total proximity effect is further based on the determined proximity effect of the feature upon the target feature.

7. The method of claim 1 wherein the measurement of exposed area of the shape includes a density value representing a ratio of exposed area to unexposed area.

8. The method of claim 1 further comprising:
    defining a third region adjacent to the first region;
    determining a proximity effect of a feature within the third region upon the target feature; and
    determining a total proximity effect for the target feature based on the proximity effect of the second region and the proximity effect of the feature.

9. A method comprising:
    receiving a design database including a plurality of features intended to be formed on a workpiece;
    selecting a target feature within the design database;
    defining a first region of the design database, wherein the first region includes the target feature;
    defining a second region outside the first region, wherein the second region is located sufficiently close to the target feature to have a measureable lithographic proximity effect upon the target feature;
    determining a total exposed area and a center point of a plurality of features located within the second region;
    defining an approximation shape centered at the center point and having a metric of exposed area corresponding to the total exposed area of the plurality of features located within the second region; and
    determining a proximity effect of the second region upon the target feature based on the approximation shape, wherein the determining of the proximity effect is performed using a computer.

10. The method of claim 9 further comprising:
    determining a proximity effect of a feature within the first region upon the target feature; and
    determining a total proximity effect for the target feature based on the proximity effect of the second region and the proximity effect of the feature.

11. The method of claim 9 further comprising:

determining a proximity effect compensation based on the proximity effect of the second region; and providing the design database and the proximity effect compensation for manufacturing.

12. The method of claim 11, wherein the proximity effect compensation is configured to adjust an exposure dose in order to equalize intensities across a plurality of target features of the design database.

13. The method of claim 11 further comprising determining a critical dimension produced by the proximity effect compensation in order to verify the proximity effect compensation.

14. The method of claim 9, wherein the metric of exposed area includes a density value representing a ratio of exposed area to unexposed area within the second region.

15. A method of verifying a proximity effect compensation, the method comprising:

receiving a design database including a plurality of features intended to be formed on a workpiece;

defining a target region of the design database, wherein the target region includes a target feature;

defining a region of the design database proximate to the target region;

determining an exposed area within the region;

defining a shape located at a center of mass of the exposed area within the region having a measurement of exposed area corresponding to the exposed area within the region;

determining a proximity effect of the region upon the target feature based on the defined shape, wherein the proximity effect accounts for a proximity effect compensation applied to a feature located within the region, and wherein the determining of the proximity effect is performed using a computer; and evaluating the proximity effect compensation based on the proximity effect of the region upon the target feature.

16. The method of claim 15, wherein the evaluating of the proximity effect compensation includes determining a critical dimension of a feature corresponding to the target feature.

17. The method of claim 15, wherein the evaluating of the proximity effect compensation includes evaluating the reliability of a feature corresponding to the target feature.

18. The method of claim 15, wherein the evaluating of the proximity effect compensation includes determining a total exposure dose at the target feature relative to a resist threshold.

19. The method of claim 15, wherein the evaluating of the proximity effect compensation includes determining whether an unintended feature would be formed at the target feature.

20. The method of claim 15, wherein the measurement of exposed area includes a ratio of exposed area to unexposed area within the region.

* * * * *